(12) United States Patent
Sulimarski (10) Patent No.: US 9,628,305 B2
(45) Date of Patent: Apr. 18, 2017

(54) SYSTEMS AND METHODS TO COMPENSATE FOR MEMORY EFFECTS USING ENHANCED MEMORY POLYNOMIALS

(71) Applicant: Intel IP Corporation, Santa Clara, CA (US)

(72) Inventor: Avi Sulimarski, Kfar Oranim (IL)

(73) Assignee: Intel IP Corporation, Santa Clara, CA (US)

( * ) Notice: Subject to any disclaimer, the term of this patent is extended or adjusted under 35 U.S.C. 154(b) by 123 days.

(21) Appl. No.: 14/178,930

(22) Filed: Feb. 12, 2014

(65) Prior Publication Data

US 2015/0229498 A1    Aug. 13, 2015

(51) Int. Cl.
| | |
|---|---|
| *H04K 1/02* | (2006.01) |
| *H04L 25/03* | (2006.01) |
| *H04L 25/49* | (2006.01) |
| *H04L 25/08* | (2006.01) |
| *H04L 1/00* | (2006.01) |
| *H04L 1/20* | (2006.01) |
| *H04L 27/36* | (2006.01) |
| *H03F 1/32* | (2006.01) |
| *H03F 3/189* | (2006.01) |
| *H03F 3/24* | (2006.01) |

(52) U.S. Cl.
CPC .......... *H04L 25/08* (2013.01); *H03F 1/3247* (2013.01); *H03F 1/3258* (2013.01); *H03F 3/189* (2013.01); *H03F 3/24* (2013.01); *H04L 1/0033* (2013.01); *H04L 1/206* (2013.01); *H04L 27/368* (2013.01); *H03F 2201/3224* (2013.01); *H03F 2201/3233* (2013.01)

(58) Field of Classification Search
CPC ........ H04L 25/08; H04L 1/206; H04L 1/0033
USPC ...................................................... 375/297
See application file for complete search history.

(56) References Cited

U.S. PATENT DOCUMENTS

| | | | |
|---|---|---|---|
| 7,139,327 B2 | 11/2006 | Vella-Coleiro et al. | |
| 7,804,359 B1* | 9/2010 | Cova .............................. | 330/149 |
| 2013/0195221 A1* | 8/2013 | Lozhkin ....................... | 375/297 |
| 2013/0321078 A1* | 12/2013 | Ishikawa et al. ............. | 330/149 |
| 2015/0162881 A1* | 6/2015 | Hammi ......................... | 330/291 |

* cited by examiner

*Primary Examiner* — Nader Bolourchi
(74) *Attorney, Agent, or Firm* — Eschweiler & Potashnik, LLC (57) ABSTRACT

A system for mitigating non-linearity distortions from a memory effect is disclosed. The system includes an enhanced predistortion component, a power amplifier, and a lookup table. The enhanced predistortion component is configured to receive an input signal, to obtain a plurality of enhanced memory polynomials based on a plurality of samples of the input signal and to generate a pre-distorted signal from the input signal according to the enhanced memory polynomials and the plurality of samples of the input signal. The power amplifier is configured to receive the pre-distorted signal and to generate an output signal.

4 Claims, 6 Drawing Sheets

SYSTEMS AND METHODS TO COMPENSATE FOR MEMORY EFFECTS USING ENHANCED MEMORY POLYNOMIALS

BACKGROUND

Communication systems, in particular wireless communication systems, utilize power amplifiers to modulate signals as part of the communication process. The power amplifiers should have certain characteristics in order to perform suitable modulation of baseband signals. This suitable modulation requires that distortions and noise are mitigated to sufficient levels.

In one example, non-linear power amplifiers are utilized for amplitude to amplitude modulation. However, amplitude to phase modulation effects can occur to yield distortions or noise in the amplitude modulation signal.

One technique to mitigate the phase modulation effects is to stimulate a non-linear power amplifier with baseband samples and then observe the result of that stimulus at the power amplifier output. Then, the amplitude to amplitude modulation and amplitude to phase modulation effects of the power amplifier are estimated. These estimated distortions are then removed from the power amplifier by pre distorting the input stimulus with their inverse equivalents.

However, there are other distortions or noise that can be introduced into power amplifiers that degrade or mitigate their performance, including modulation.

DETAILED DESCRIPTION

The systems and methods of this disclosure are described with reference to the attached drawing figures, wherein like reference numerals are used to refer to like elements throughout, and wherein the illustrated structures and devices are not necessarily drawn to scale.

Systems and methods are disclosed that address both non-linearity distortions and other distortions including those from the memory effect. The systems and methods include mechanisms that address memory effects using digital correction and an enhanced memory polynomial.

A memory effect in power amplifiers is a distortion or error introduced at higher bandwidths, such as 40, 80, and 160 MHz. The memory effect is not typically present in smaller bandwidth systems. However, as the bandwidths increase, so does the impact of the memory effect. The memory effect is in addition to non-linearity power amplifier distortions and can be attributed to other components within a communication system, such as components within/along a transmit path, a receive path, and the like.

Predistortion mechanisms are generally used to address linearity issues or problems in power amplifiers without memory effect. The non-linearity distortions are estimated and used to pre-distort an input stimulus with their inverse equivalents. So doing substantially removes these non-linearity distortions in output signals. However, these do not account for the memory effect and distortions resulting from the memory effect.

Memory effects are not typically present in smaller bandwidth systems. As bandwidth increases, so does the memory effect.

Memory effects result in changing distortions over time. Thus, the inverse equivalents of the distortions change over time. Traditional mechanisms that account for power amplifier non-linearity are insufficient to account and compensate for the memory effect. Thus, the below systems, methods, and variations thereof utilize pre-distortion with an enhanced memory polynomial that accounts for non-linearity with memory effect.

Figure 1:
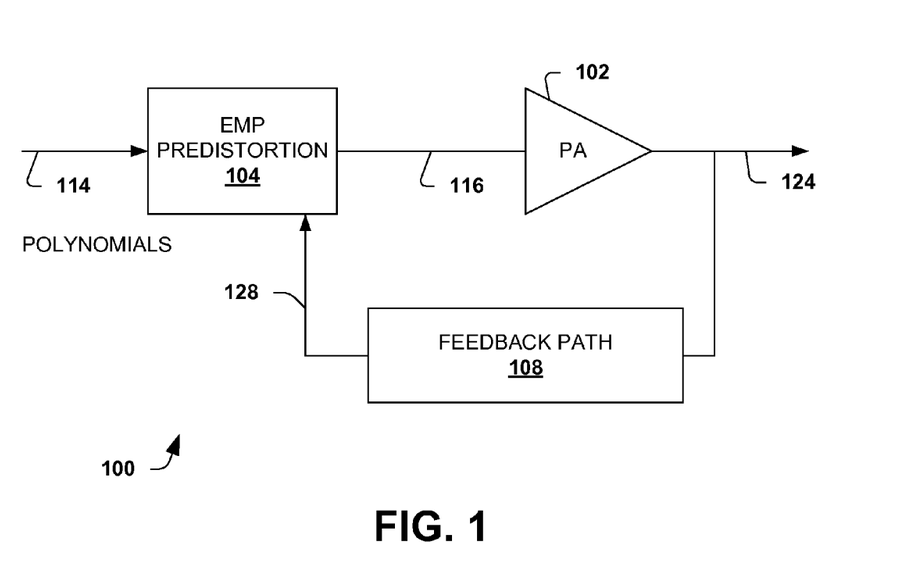
FIG. 1 is a diagram illustrating a system for mitigating distortions including distortions from the memory effect.

FIG. 1 is a diagram illustrating a system 100 for mitigating non-linearity distortions and distortions from the memory effect. The system 100 utilizes enhanced memory polynomials (EMP) to digitally correct or compensate for non-linearity distortion and other distortions, including distortions from the memory effect. The non-linearity is typically due to non-linearity present in power amplifiers. The memory effect can be contributed by amplifiers and other components along a transmit path, receive path, and the like. Systems such as the system 100, typically encounter memory effects for relatively large bandwidths, such as 40, 80, 160 MHz and the like.

The system 100 includes an EMP predistortion component 104, a power amplifier 102, and a feedback path 108. The power amplifier 102 receives a pre-distorted input signal 116 and generates an output signal 124. The power amplifier 102 generally has a non-linearity that introduces distortions/noise. However, the pre-distorted input signal 116 is pre-distorted in order to compensate for power amplifier distortions and the memory effect. In one example, the pre-distorted input signal 116 includes a predistortion that is or includes an inverse of non-linearity distortions and other distortions from the memory effect. The predistortion compensates for the non-linearity in other distortions. As a result, the output signal 124 is generated substantially free of non-linearity distortions and other distortions resulting from the memory effect. In one example, the power amplifier 102 is utilized for amplitude modulation.

A feedback path 108 provides a feedback signal 128. The feedback path 108 can include couplers, down conversion components, alignment components, and the like. The feedback signal 128 conveys information from the output signal 124 and can be utilized to modify polynomials, coefficients, and/or coefficients during training processes, calibration processes and the like.

The EMP predistortion component 104 applies a memory compensated pre-distortion to an input signal 114 to generate the pre-distorted input signal 116. The input signal 114 is a baseband signal, in this example. The EMP predistortion component 104 obtains samples of the input signal 114, including a current sample and one or more previous samples. The samples are used with an enhanced memory polynomial model to pre-distort the input signal. The model includes and utilizes polynomials, a specified number of polynomials (Q), and a number of samples (k).

The previous samples can be stored in a memory, delay components, and the like. The samples are used to address or lookup polynomials for polynomial model(s). The polynomials include enhanced memory polynomials, which include memory polynomials and extra memory polynomials. The enhanced model polynomial (EMP) is then used to generate the pre-distorted input signal 116 from the input signal 114 using the samples and the polynomials. Alternatively, the EMP predistortion component 104 is configured to determine when only the memory polynomials are sufficient to pre-distort the input signal. So doing can reduce the time and complexity required to pre-distort the input signal 114.

The polynomials used to pre-distort the input signal 114 are typically maintained with a lookup table, which can be internal or external to the distortion component 104. The polynomials are generated/determined by a suitable process, such as a training process described below. Additionally, the polynomials can be updated during operation by the distortion component 104 in order to improve or enhance performance. In an alternate example, the polynomials are calculated as needed.

The number of polynomial terms Q and the number of samples k impact performance of the model. Generally, less terms Q and less samples k mean less calculation complexity. More Q and more samples k, generally imply superior distortion removal or avoidance. Typically, a calibration process is performed to determine a suitable number of Q terms and k samples.

Additional details of the model are provided below. The pre-distortion accurately estimates linearity distortions with memory effects.

Figure 2:
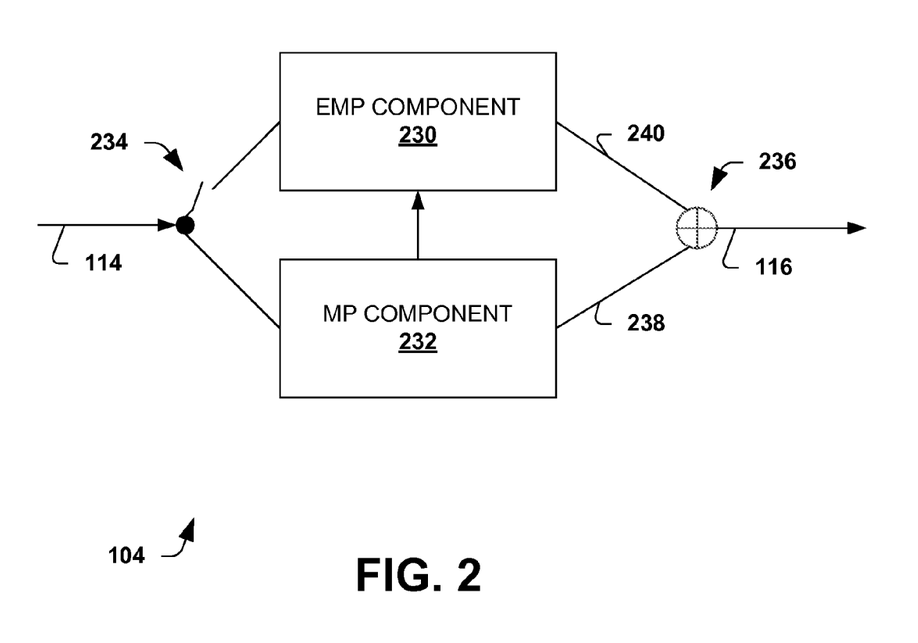
FIG. 2 is a diagram illustrating portions of an EMP distortion component for applying pre-distortion to an input signal subject to memory effects.

FIG. 2 is a diagram illustrating portions of an EMP distortion component 104 for applying pre-distortion to an input signal subject memory effects. The distortion component 104 can be used with the system 100, described above.

The component 104 is shown with an enhanced memory polynomial component (EMP) 230, a memory polynomial (MP) component 232, a switch 234 and a summation component 236. The switch 234 is configured to selectively connect or disconnect the EMP component 230. When connected, the EMP component 230 receives an input signal 114. When disconnected, the EMP component 230 does not receive the input signal 114 and only the MP component 232 is used.

The MP component 232 receives the input signal 114 and generates an MP signal as its output signal 238. The MP component 232 uses a number of polynomials, referred to as memory polynomials and samples, including a current sample and previous samples, to generate its output. The samples are of the input signal 114. The memory polynomials can be calculated and/or obtained from a lookup table.

The EMP component 230 selectively receives the input signal 114 via the switch 234. The EMP component 230 can be effectively turned OFF by disconnecting it from the input signal 114 using the switch 234. In one example, the EMP component 230 is turned off in selected scenarios, such as to reduce power. Turning off the EMP component 230 can mitigate power consumption and reduce complexity. In alternate examples, the EMP component 230 is turned OFF using another mechanism instead of the switch 234.

The EMP component 230 uses extra polynomials in addition to the memory polynomials. The extra polynomials and the memory polynomials are collectively referred to as enhanced memory polynomials (EMP). The extra polynomials are used to add a second pre-distortion, referred to as the EMP pre-distortion, to the input signal and provide the combined signal at its output 240.

The output of the EMP component 230 and the output of the MP component 232 are combined by summation component 236, which combines both signals to generate the pre-distorted input signal 116. By using the EMP component 230, the pre-distortion within the input signal 116 adequately compensates for linearity distortions with the memory effect.

The following is an equation for the generated pre-distorted input signal 116.

$$F[x(n)] = \Sigma_{k=1}^{K} \Sigma_{q=0}^{Q-1} a_{kq} x(n-q) |x(n-q)|^{k-1} \Sigma_{k=2}^{K} \Sigma_{q=1}^{Q-1} b_{kq} x(n) |x(n-q)|^{k-1} \quad (1)$$

For equation (1): x(n) is the input signal 114, F[x(n)], is the pre-distorted input signal 116, K is a number of samples, Q is a number of polynomials, α are coefficients for the MP component 232, and b are coefficients for the EMP component 230. The coefficients can be generated or learned during a training process.

It can be seen that MP component 232 uses a left side portion of the equation to produce its output signal 238 and is given by:

$$\Sigma_{k=1}^{K} \Sigma_{q=0}^{Q-1} a_{kq} x(n-q) |x(n-q)|^{k-1} \quad (2)$$

The EMP component 230 uses an extra portion of the equation to produce its output signal 240 and is given by:

$$\Sigma_{k=2}^{K} \Sigma_{q=1}^{Q-1} b_{kq} x(n) |x(n-q)|^{k-1} \quad (3)$$

It is appreciated that the components 232 and/or 230 can be implemented in circuitry and/or as instructions provided from a memory and executed by a processor.

Figure 3:
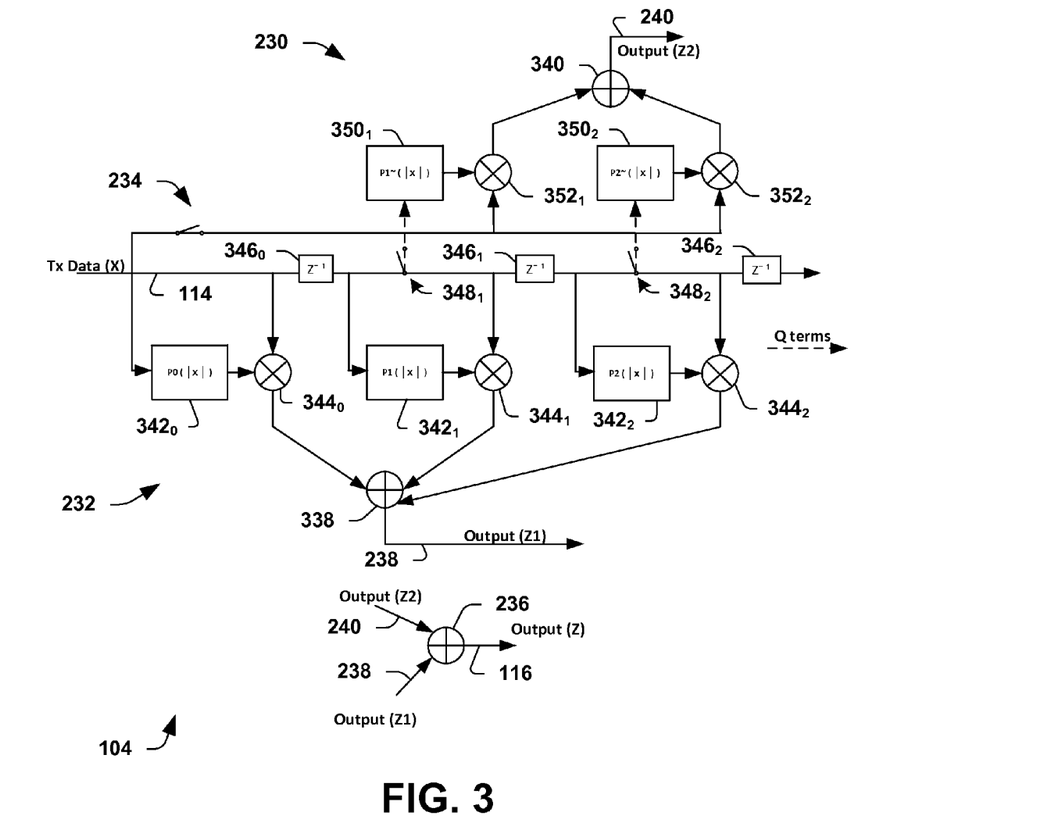
FIG. 3 is a more detailed view of a pre-distortion component having EMP and MP components adding pre-distortions to an input signal.

FIG. 3 is a more detailed view of a pre-distortion component 104 having EMP and MP components adding pre-distortions to an input signal. The distortion component 104 can be used with the system 100, described above.

The component 104 receives an input signal 114 applies an MP pre-distortion and an EMP pre-distortion and combines them to provide the pre-distorted signal 116.

The components 230 and 232 are configured in stages. Each stage uses a current input signal or previous samples of the input signal 114. Delay elements $346_0$ to $346_{Q-1}$, collectively 346, are present to provide the previous samples. Each stage generally includes a polynomial term and a multiplexor or multiplexor to combine the polynomial for that stage with the sample for that stage.

For example, a first stage of the MP component 232 includes a first polynomial $342_0$ and a multiplexor $344_0$. The multiplexor $344_0$ multiples a sample of the input signal 114 with the polynomial component $342_0$. The output of the multiplexor $344_0$ is provided to summation component 338. The output is also referred to as a Q term. The output is added with other Q terms by the summation component 338 to yield a MP distorted signal, shown as Z1. The other stages of the MP component 232 are configured to operate in a similar manner.

A first stage of the EMP component 230, for example, includes an EMP polynomial $350_1$ and a multiplexor $352_1$. The multiplexor $352_1$ multiples a delayed sample, delayed by the delay element $346_0$, with the EMP polynomial component $350_1$. The output of the multiplexor $352_1$ is provided to summation component 340. The output is also referred to as an EMP Q term. The output is added with other EMP Q terms by the summation component 340 to an output signal 240, shown as Z2. The other stages of the EMP component 230 are configured to operate in a similar manner.

The memory polynomials are provided by the below equations which are derived from equation (3). Generally, an absolute value of the sample is used to index or address an entry from a look up table.

$$P0(|x|) = a_{10}|x_0|^0 + a_{20}|x_0|^1 + \ldots a_{k0}|x_0|^k + \ldots a_{k0}|x_0|^k$$

$$P1(|x|) = a_{11}|x_1|^0 + a_{21}|x_1|^1 + \ldots a_{k1}|x_1|^k + \ldots a_{k1}|x_1|^k$$

$$PQ(|x|) = a_{1Q}|x_Q|^0 + a_{2Q}|x_Q|^1 + \ldots a_{kQ}|x_Q|^k$$

The enhanced memory polynomials include the extra polynomials shown below. Similarly, an absolute value of the sample is used to index or address an entry from a lookup table.

$$P1\sim(|x|) = b_{21}|x_1|^1 + b_{31}|x_1|^2 + \ldots b_{k1}|x_1|^{k-1}$$

$$P2\sim(|x|) = b_{22}|x_2|^1 + b_{32}|x_2|^2 + \ldots b_{k2}|x_2|^{k-1}$$

$$PQ\sim(|x|) = b_{2Q}|x_Q|^1 + b_{3Q}|x_Q|^2 + \ldots b_{kQ}|x_Q|^{k-1}$$

Summation component 236 combines the MP distorted signal Z1 and the signal Z2 in order to generate the pre-distorted input signal 116. By using the EMP component 230, the pre-distortion within the input signal 116 substantially compensates for non-linearity distortions and the memory effect.

Figure 4:
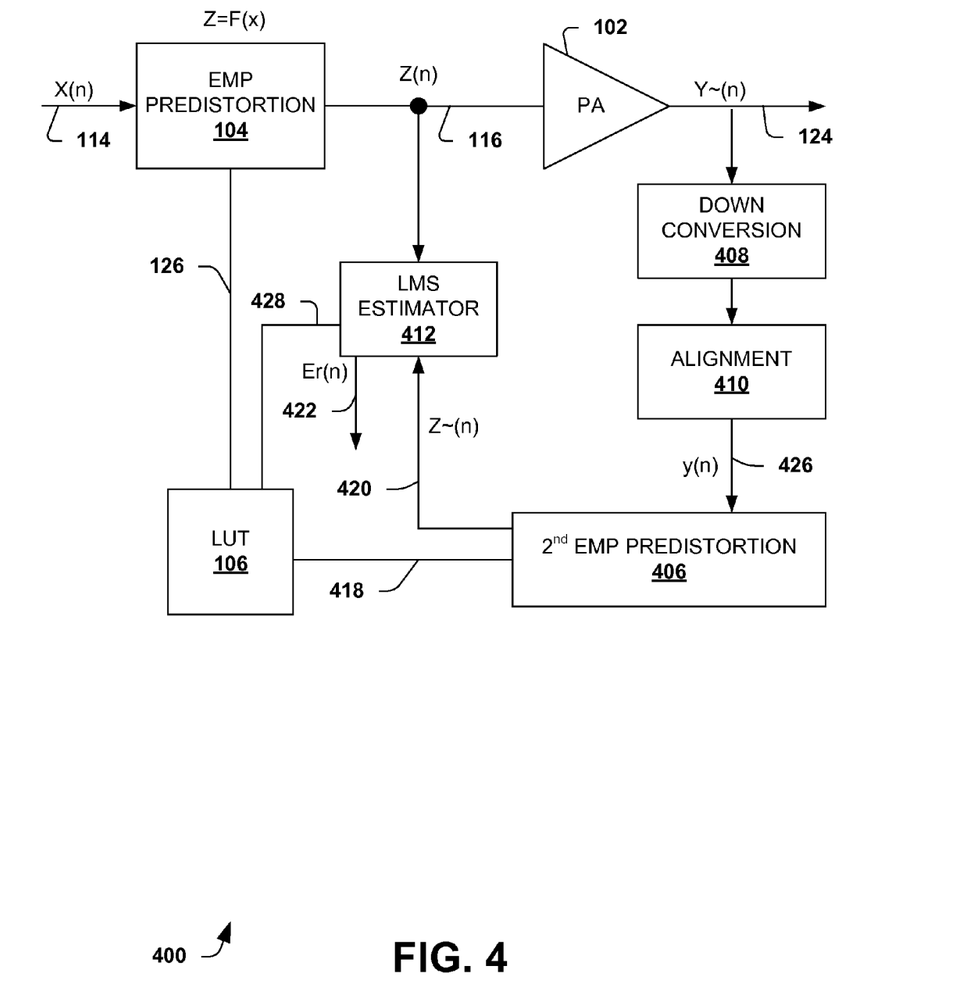
FIG. 4 is a diagram illustrating a system for mitigating distortions and having a training process.

FIG. 4 is a diagram illustrating a system 400 for mitigating linearity distortions and distortions from the memory effect and a training process. The system 400 utilizes enhanced memory polynomials (EMP) to digitally correct or compensate for memory effects in a modulated output signal by using a digital pre-distortion. The system 400 is configured to perform a training process learn filter coefficients and polynomials.

The system 400 includes an EMP predistortion component 104, a power amplifier 102, a second EMP predistortion component 406, a down conversion component 408, an alignment component 410 and an LMS estimator 412. The system 400 operates on an input or transmit signal 414 and generates an output signal 124 substantially free from memory non-linearity distortions in the presence of memory effects.

The power amplifier 102 typically has a non-linearity that introduces non-linearity distortion. The system 400 includes other distortions, including distortion resulting from the memory effect, as described above. The distortions are modeled by a complex polynomial function, referred to as an enhanced memory polynomial (EMP) model. Additional description of the power amplifier can be found above, with regard to FIG. 1.

The power amplifier 102 generates an output signal 124 based on an input signal 116, a selected gain, and the like. The input signal 116 is a pre-distorted signal. The output signal 124 is substantially free from distortion due to pre-distortions present in the input signal 116. The pre-distortions are to be an inverse of the distortions introduced by the power amplifier and other components of the system 400. The output signal 124 is assigned the function Y~(n) and is typically used for transmission along a transmit path.

The EMP predistortion component 104 applies a memory compensated pre-distortion to an input signal 114 to generate the pre-distorted input signal 116. The EMP predistortion component 104 obtains samples of the input signal 114, including a current sample and one or more previous samples. The samples are used to index or reference polynomials 126 from a lookup table 106. The lookup table 106 is shown external to the component 104, however it is appreciated that it can also be internal to the component 104.

In order for the proper pre-distortion to be applied by the component 104, polynomials 126 and 418 are learned or obtained. Examples of the polynomials, including coefficients, are shown above. One technique to develop suitable polynomials is to utilize a training process where a near duplicate of the EMP distortion component 104, the second predistortion component 406, is used to similarly apply predistortions to an output signal 426. Then, both pre-distorted signals are compared. If the polynomials are suitable, the error or deviation between the signals is about zero or within a selected threshold. Otherwise, the polynomials are modified and/or adjusted iteratively until suitable polynomials.

A feedback portion includes the down conversion component 108, the alignment component 410, the second pre-distortion component 406 and the LMS estimator 412. The down conversion component 408 generates a down converted signal from the output signal 424 and provides it at its output. The alignment component 410 operates on the output signal from the down conversion component in order to provide the output signal 426 that is aligned in amplitude, phase, gain and delay to the input signal 114 so that the estimated polynomials model the non-linearity and other distortions from the memory effect. The output signal 426 is assigned as y(n).

The second pre-distortion component 406 applies a pre-distortion to the output signal 426 and provides a pre-distortion comparison signal 420, assigned Z~(n), to an error estimator 412. The second pre-distortion component 406 uses the polynomials 418 from the lookup table 106. Generally, the polynomials 418 are substantially the same or identical to the polynomials used by the pre-distortion component 104. The error estimator 412 compares the signals 420 and 116 and generates an error signal 422. The estimator 412 or another component uses the error signal 422 to modify the polynomials stored within the lookup table 106. The training process can be performed iteratively until the error signal 422 is zero or is at an acceptable level.

In one example, the polynomials, including their filter weights/coefficients, are adjusted by a step amount in a direction indicated by the error signal 422. The error estimator 412 can be configured to determine the adjustments.

Mathematically, the polynomials are proper when y=x and F(y)=F(x), where y is the converted, aligned output signal 426, x is the input signal 114, F(y) is the comparison signal 420 and F(x) is the pre-distorted signal 116. In order to obtain the polynomials for MP or EMP polynomials, which include the coefficients α, for the MP component or portion, and b for the EMP component or portion, equation 1 is solved for F(y) and F(x).

Figure 5:
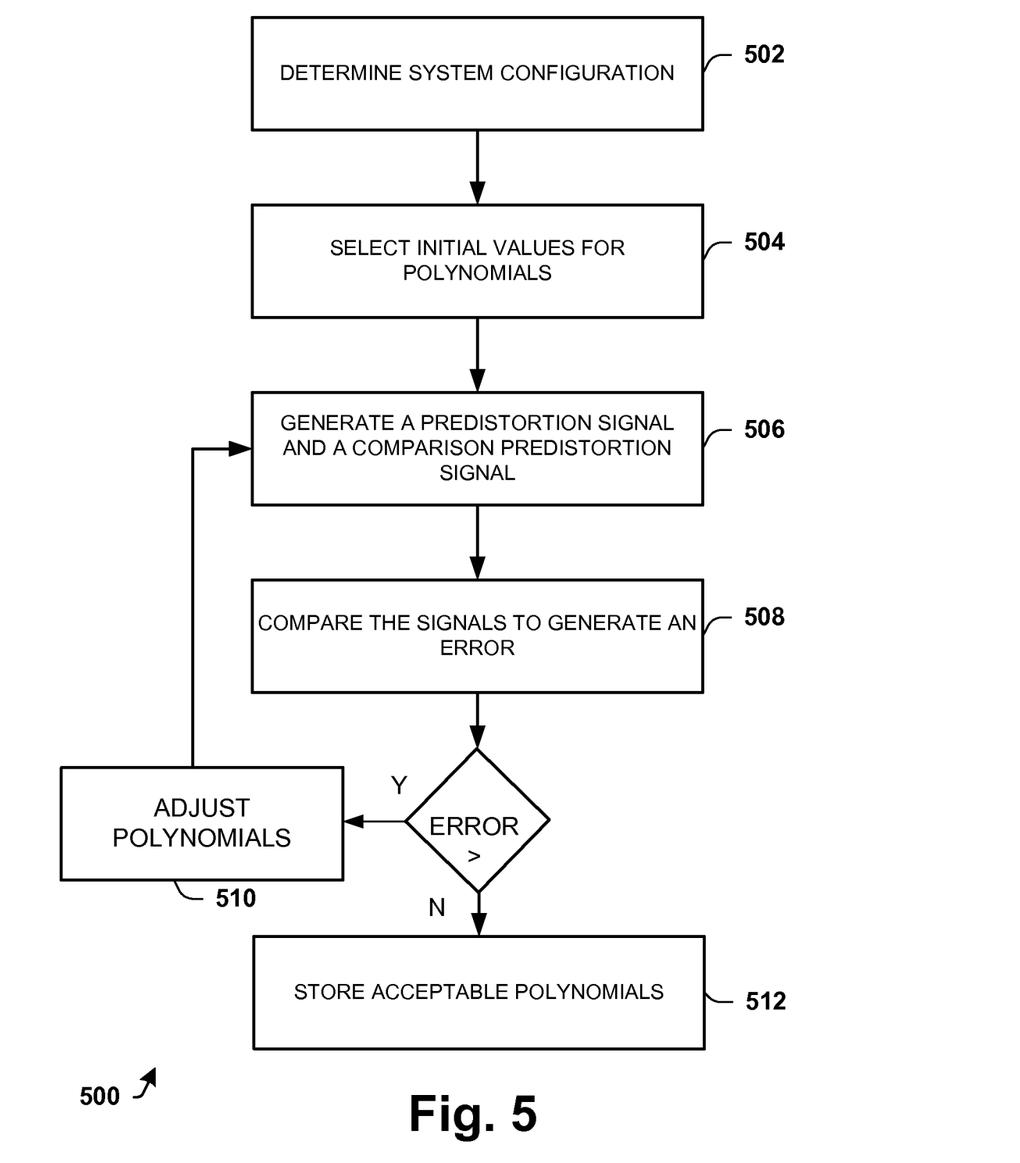
FIG. 5 is a flow diagram illustrating a method of training a predistortion component for non-linearity distortion and distortions from the memory effect.

FIG. 5 is a flow diagram illustrating a method 500 of training a predistortion component for non-linearity distortion and distortions from the memory effect. The method 500 uses an enhanced polynomial model to model the distortions. Polynomials of the model are iteratively adjusted in order to more accurately model distortions present within a system. Components of systems described above, including system 400, are referenced to facilitate understanding of the method 500.

Distortions are often present in transmission systems, including systems using a power amplifier. The distortions include non-linearity distortion and distortions from memory effect. As shown above, non-linearity distortions are introduced by non-linearity of the power amplifier. Other distortions from system components result from the memory effect. Traditional pre-distortion techniques do not adequately account for the distortions from the memory effect.

A predistortion component determines a number of samples and polynomial terms at block 502 during a system configuration. These include Q, the number of polynomial terms and k, the number of samples (including previous samples) to be maintained.

The predistortion component selects initial values for the polynomials at block 504. The initial values can be determined from similar systems and the like.

The predistortion component applies a pre-distortion to an input signal and a second predistortion component also applies the pre-distortion to a modified output signal at block 506. The predistortion component uses the polynomials and samples of the input signal to generate a pre-distorted signal, which includes the predistortion. A power amplifier amplifies the pre-distorted signal to generate an output signal. One or more components modifies the output signal as described, for example, in the description of FIG. 4. The second predistortion component also applies the pre-distortion to the modified output signal using the same polynomials to generate a comparison pre-distorted signal.

An estimator, such as the LMS estimator 412, compare the pre-distorted signal and the comparison pre-distorted signal at block 508 in order to generate an error. If the polynomials suitable represent the distortions present in the system, the signals should be about equal or substantially similar. Otherwise, and adjustment to the polynomials or the coefficients of the polynomials is needed.

Upon the error exceeding a threshold value, the estimator adjusts the polynomials by a step amount in a direction indicated by the error at block 510. The method 500 returns back to block 506, wherein the method continues with the adjusted polynomials.

Upon the error being acceptable, the estimator stores the polynomial values in a lookup table or other suitable mechanism at block 512.

Figure 6:
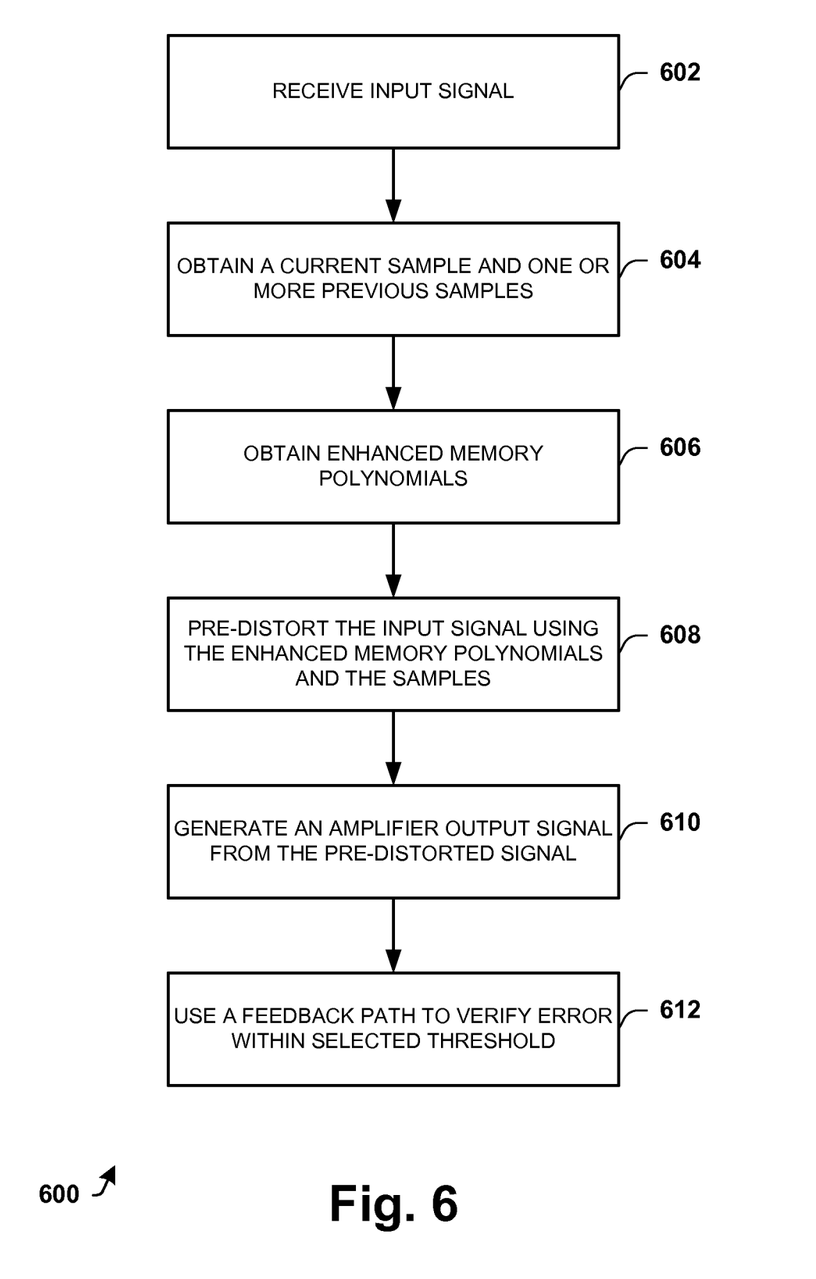
FIG. 6 is a flow diagram illustrating a method of mitigating distortions in a communication system.

FIG. 6 is a flow diagram illustrating a method 600 of mitigating distortions in a communication system. The method 600 uses an enhanced polynomial model to pre-distort an input signal for transmission. The signal is subsequently provided to a power amplifier having non-linearity distortions. Other distortions are present in the system from the memory effect. The power amplifier suitably amplifies the signal as the pre-distortion at least partially compensates for the non-linearity distortions and other distortions from the memory effect.

An EMP predistortion component, such as component 104 described above, receives an input signal at block 602. The signal is to be amplified and transmitted for communication purposes, in one example. The EMP predistortion component utilizes enhanced memory polynomials or memory polynomials as part of a polynomial model.

The EMP predistortion component samples the input signal to obtain a current sample and one or more previous samples at block 604. In one example, the component uses delay elements to temporarily store previous samples.

The predistortion component obtains polynomials, including enhanced memory polynomials or memory polynomials, from a lookup table using the current sample and the previous samples at block 606. The samples are used as indexes to polynomials as provided by Equation 1, above. An example of a suitable lookup table is described above as lookup table 106. Alternatively, the polynomials can be calculated.

The predistortion component pre-distorts the input signal at block 608. The predistortion component uses the polynomials obtained in block 606 and the samples obtained at block 604 to perform the predistortion. In one example, the predistortion component pre-distorts the input signal as described above in conjunction with FIG. 3.

An amplifier output signal is generated from the pre-distorted signal at block 610 using a power amplifier. Examples of suitable amplifiers are described above. The output signal is generated according to a selected gain. Distortions from non-linearity and the memory effect are at least partially removed due to the pre-distortion.

A feedback path is used to verify an error of the output signal is within a selected threshold at block 612. It is appreciated that alternate versions of this method 600 can omit this block. The feedback path processes the output signal. The feedback path applies a predistortion to the output signal as was applied to the input signal to generate a comparison signal. An example of generating such a signal is provided above with regard to FIG. 4. The comparison signal is compared with the pre-distorted signal to generate an error. If there error is less than or equal a threshold value, suitable performance is verified. Otherwise, calibration or training, such as using the method 500, can be performed to reduce the error.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A system for mitigating non-linearity distortions and distortions from a memory effect is disclosed. The system includes an enhanced predistortion component, a power amplifier, and a lookup table. The enhanced predistortion component is configured to receive an input signal, to obtain a plurality of enhanced memory polynomials based on a plurality of samples of the input signal and to generate a pre-distorted signal from the input signal according to enhanced memory polynomials and samples of the input signal. The power amplifier is configured to receive the pre-distorted signal and to generate an output signal.

In one example of the system, a lookup table is configured to provide the enhanced memory polynomials to the enhanced predistortion component based on the plurality of samples.

In a variation of any of the above systems, the enhanced polynomials include coefficients. In another variation of any of the systems, the system further includes a feedback path coupled to the enhanced predistortion component.

In another variation of any of the systems, the lookup table is modified using a comparison signal provided by the feedback path. The comparison signal is a pre-distorted version of the output signal.

In another variation, the feedback path is configured to determine an error and verify that the error is within a selected threshold.

In another variation, the enhanced perdistortion component includes a memory polynomial component configured to pre-distort the input signal using only a portion of the enhanced memory polynomials. In another variation, the feedback path is configured to develop the polynomials during a training process.

An enhanced pre-distortion component includes a memory polynomial component, an enhanced memory polynomial component, and a summation component. The memory polynomial component is configured to generate a first signal according to memory polynomials, a current sample of an input signal and previous samples of the input signal. The enhanced memory polynomial is configured to generate a second signal according to enhanced memory polynomials and the previous samples of the input signal. The summation component is configured to combine the first and second signals into a pre-distorted signal having pre-distortions that at least partially compensate for distortions from the memory effect.

In one variation, the enhanced memory polynomial component includes a plurality of stages, where each stage combines one of the enhanced memory polynomials with one of the previous samples to provide a portion of the second signal.

In another variation of any of the components, the memory polynomial includes a plurality of stages. Each stage combines one of the memory polynomials with one of the previous samples and the current sample to provide a portion of the first signal.

In another variation, the component includes a switch component coupled to the enhanced memory polynomial component configured to selectively decouple the enhanced memory polynomial component from the summation component.

In another variation of any of the components, the component includes a lookup table configured to provide the enhanced memory polynomial s and the memory polynomials to the enhanced memory polynomial component and the memory component.

A method is disclosed for mitigating linearity distortions and distortions from memory effect is disclosed. An input signal is received. The input signal is sampled to obtain a current sample and one or more previous samples. Enhanced memory polynomials are obtained according to the current sample and the previous samples. The input signal is pre-distorted using the enhanced memory polynomials and the samples to generate a pre-distorted signal.

In one variation, the method additionally includes generating an output signal from the pre-distorted signal. In another variation, the method also generates and error signal according to the pre-distorted signal and the amplifier output signal. In another variation of any of the methods, the method additionally performs a training process to adjust the enhance polynomials upon the error exceeding a selected threshold.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for mitigating linearity distortions and distortions from memory effect, the method comprising:
   receiving an input signal;
   sampling the input signal using a plurality of delay elements to obtain a plurality of samples, the plurality of samples including a current sample and one or more previous samples of the input signal;
   obtaining memory polynomials according to the current sample and the one or more previous samples;
   obtaining enhanced memory polynomials according to the current sample and the one or more previous samples;
   generating a plurality of memory polynomial stage outputs by combining the memory polynomials with the current sample and the one or more previous samples;
   combining the plurality of memory polynomial stage outputs into a first pre-distorted signal of the input signal;
   generating a plurality of enhanced memory polynomial stage outputs by combining the enhanced memory polynomials with the one or more previous samples;
   combining the plurality of enhanced memory polynomial stage outputs into a second pre-distorted signal of the input signal; and
   generating an enhanced pre-distorted signal by combining the first pre-distorted signal and the second pre-distorted signal and generating the enhanced pre-distorted signal from only the first pre-distorted signal on an enhanced polynomial component being OFF.

2. The method of claim 1, further comprising generating an amplifier output signal from the pre-distorted signal.

3. The method of claim 1, further comprising generating an error according to the pre-distorted signal and the amplifier output signal.

4. The method of claim 3, further comprising performing a training process to adjust the enhanced polynomials upon the error exceeding a selected threshold, wherein the training process includes distorting the output signal using at least the enhanced memory polynomials, comparing the pre-distorted output signal with the enhanced pre-distorted signal and adjusting the enhanced polynomials based on the comparison.

\* \* \* \* \*